United States Patent [19]

Saccocio et al.

[11] Patent Number: 4,965,165
[45] Date of Patent: Oct. 23, 1990

[54] DONOR MEDIA SHELF LIFE STABILIZATION BY CONTROL OF EXPOSURE TO CONTACTING OXYGEN AND MOISTURE

[75] Inventors: Edward J. Saccocio, Bellbrook; Uday Varde, Spring Valley; David A. Hutchings, Centerville; Russell K. Messer, Kettering, all of Ohio

[73] Assignee: The Mead Corporation, Dayton, Ohio

[21] Appl. No.: 359,069

[22] Filed: May 30, 1989

[51] Int. Cl.$^5$ .............................................. G03C 1/72
[52] U.S. Cl. ..................................................... 430/138
[58] Field of Search ....................... 430/211, 138, 96.1, 430/270, 271, 399; 522/25, 26; 354/354

[56] References Cited

U.S. PATENT DOCUMENTS

| | | | |
|---|---|---|---|
| 4,399,209 | 8/1983 | Sanders et al. | 430/138 |
| 4,440,846 | 4/1984 | Sanders et al. | 430/138 |
| 4,772,530 | 9/1988 | Gottschalk et al. | 430/138 |
| 4,772,541 | 9/1988 | Gottschalk et al. | 430/339 |

*Primary Examiner*—Paul R. Michl
*Assistant Examiner*—John S. Y. Chu
*Attorney, Agent, or Firm*—Thompson, Hine and Flory

[57] ABSTRACT

A method for storing photosensitive donor media comprising the step of: placing said donor media in an air and humidity occlusive vessel; establishing an internal atmosphere in said vessel, said internal atmosphere containing about 1 to 5% oxygen and about 40 to 60% humidity; and sealing said donor media in said vessel.

8 Claims, 1 Drawing Sheet

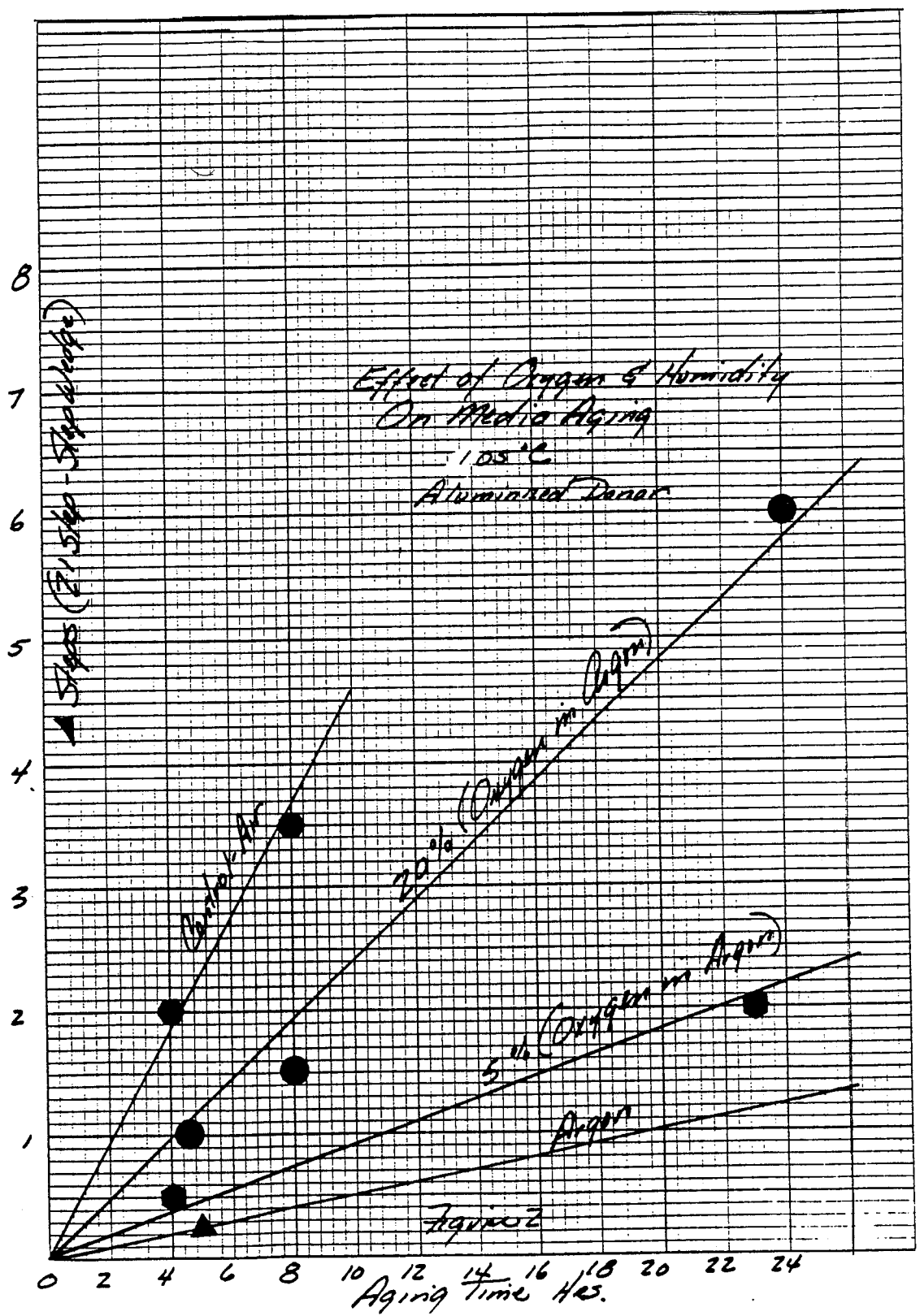

DONOR MEDIA SHELF LIFE STABILIZATION BY CONTROL OF EXPOSURE TO CONTACTING OXYGEN AND MOISTURE

1. FIELD OF THE INVENTION

The present invention relates to an imaging system. More particularly, the present invention relates to a method for improving the shelf life of an imaging system employing photosensitive microcapsules, by controlling exposure to ambient oxygen and humidity.

2. DESCRIPTION OF PRIOR ART

U.S. Pat. Nos. 4,399,209 and 4,440,846 to The Mead Corporation, which are incorporated herein, describe imaging materials and imaging processes in which images are formed through exposure-controlled release of an image-forming agent from a microcapsule containing a photohardenable composition. The imaging material is exposed image-wise to actinic radiation and the microcapsules are subjected to a uniform rupturing force. Typically the image-forming agent is a color precursor which is released image-wise from the microcapsules to a developer sheet whereupon it reacts with a developer to form a visible image.

While the method of improving the shelf life of the donor media will be discussed primarily in relation to transfer imaging systems of the type described in U.S. Pat. No. 4,399,209, the modifications which are proposed here are also applicable to the self-contained imaging systems of U.S. Pat. No. 4,440,846. Transfer systems typically utilize a photosensitive sheet (hereinafter referred to as the "donor media" or "donor sheet"), which is prepared by coating a layer of photosensitive microcapsules on a support. The donor sheet is image-wise exposed to actinic radiation, assembled with a developer sheet and passed through the nip between a pair of pressure rollers. As indicated above, images are formed by exposure controlled release of the image-forming agent. Specifically, in transfer systems, the image is obtained by the release of the image-forming agent contained within the photosensitive composition in the microcapsules on the donor sheet, and subsequent transfer of that image-forming agent to the receiver or developer sheet where it reacts to form an image thereon.

Donor sheet as manufactured under the current state of the art, suffers from the limitation that it has only a limited shelf-life. Its limited shelf-life is believed to be a result of two factors. First, where ambient oxygen is permitted to contact the donor sheet, oxidative degradation (aging) of the photoinitiator occurs resulting in a reduction of film speed over time. Second, the exposure of the donor sheet to humidity also causes premature aging of the donor sheet resulting in a decrease in the density of the image produced by the donor sheet over time.

Attempts have been made in the prior art to extend the shelf-life of donor media. Such attempts focus on refrigerated storage of the donor media. The colder temperature reduces the rate of the chemical reactions which are responsible for the degradation of the donor media. While the donor media shelf-life may be prolonged using this technique, this technique has the obvious shortcoming that substantial amounts of equipment, energy and expense are required to maintain artificially cold conditions.

Thus a need has arisen in the art for method of storing and packaging donor sheet which does not require refrigerated storage and will control the donor sheet's exposure to oxygen and humidity, resulting in extended shelf-life.

SUMMARY OF THE INVENTION

A principal object of the present invention is to provide a donor sheet having an extended shelf-life without the need for refrigerated storage by controlling the donor media's exposure to oxygen and humidity.

These and other objects are obtained in the present invention wherein donor sheet shelf-life is extended by controlling its exposure to ambient oxygen and humidity.

In a preferred embodiment of the present invention, a method for storing a photosensitive donor media is disclosed, comprising the step of:

enclosing said media in an air and humidity occlusive vessel; said vessel containing an internal atmosphere including about 1 to 5% oxygen; and about 40 to 60% relative humidity. The aforesaid vessel may be comprised of a sealable, air and water occlusive enveloping material. Sealing may be achieved using heat, ultrasonic or any of the methods generally known by those skilled in the art.

The internal atmosphere may be introduced into said vessel by the process of:

(a) placing said photosensitive media into said vessel under a vacuum;

(b) releasing said vacuum before sealing said vessel and allowing said vessel to backfill with a pre-determined internal atmosphere containing oxygen and humidity within said ranges; and (c) sealing said vessel to maintain said internal atmosphere within said vessel.

Alternatively, the internal atmosphere may be introduced into said vessel by the process of:

(a) placing said photosensitive media into said vessel under a pre-determined internal atmosphere containing oxygen and humidity within the aforesaid ranges; and (b) sealing said vessel to maintain said internal atmosphere within said vessel.

In still another alternative, the internal atmosphere may be introduced into said vessel by:

(a) inserting said photosensitive media into a vessel;

(b) adding an oxygen scavenging material into said vessel to establish and maintain an atmosphere containing oxygen within said ranges;

(c) adding a desiccating material into said vessel to establish and maintain an atmosphere containing humidity within said ranges; and (d) sealing said vessel to permanently maintain said internal atmosphere within said vessel.

The present invention also discloses photosensitive donor media having improved shelf-life comprising:

(a) a photosensitive media comprising a support having a layer of microcapsules containing a photohardenable composition on the surface thereof; and (b) an air and water occlusive vessel containing an internal atmosphere of 1% to 5% oxygen and 40% to 60% relative humidity;

(c) wherein said media is sealed in said vessel.

BRIEF DESCRIPTION OF THE DRAWINGS

FIG. 1 is a plot of the change in shoulder speed (step no.) versus aging time at 105° C.: in air; 20% oxygen in argon; 5% oxygen in argon; and 100% argon.

DETAILED DESCRIPTION OF THE INVENTION

The present invention provides a means for improving the shelf-life of imaging systems employing photosensitive microcapsules. Imaging systems utilizing photosensitive microcapsules are described in U.S. Pat. Nos. 4,399,209, 4,440,486, 4,772,530 and 4,772,541. To the extent necessary, the teachings of these patents with respect to the image-forming agents, developer materials, microcapsule walls, microencapsulation techniques, photohardenable compositions, or to otherwise complete the teachings herein are hereby incorporated by reference.

It has been found that media shelf-life is limited by oxidative degradation of the photoinitiator.

It has also been found that a total exclusion of oxygen from the donor media is not desirable either. As oxygen inhibits polymerization, the presence of a limited amount of oxygen is desirable to prevent premature polymerization of the donor media upon storage. For example, with a total absence of oxygen, the donor media will polymerize thermally before it is exposed to actinic radiation, rendering the donor media useless as a photosensitive imaging media. Thus it has been determined experimentally that where the amount of oxygen in the internal atmosphere falls below a level of 0.5% at a temperature of 105° C. for a time period of 8 hours, the internal phase of the microcapsule will prematurely polymerize and a reduction in the density of the image will result.

At the same time, if the donor media is stored in the air (which is typically about 20% oxygen), over time the media loses film speed. In accordance with the present invention the donor media is stored with enough oxygen to prevent thermal polymerization but not so much that long term storage stability is unsatisfactory. It has been found that for optimum shelf-life of the donor media, it is critical to package and/or store the donor media in an environment wherein the level of oxygen is maintained in a range of about 1% to 5%.

Similarly, it has been found that there exists an optimum humidity range to obtain maximum shelf-life of the donor media of approximately 40 to 60% relative humidity. If ambient humidity is present in excess of that optimum range, the density of the image produced decreases rapidly over time. On the other hand, if the ambient humidity is present in an amount lower than that of the optimum range, the microcapsules are believed to dry out and the density of the image again decreases over time.

Those skilled in the art will appreciate that there are numerous ways to package and/or store the donor media in an environment having the desired oxygen level.

In one embodiment of the present invention, after it is manufactured, donor media is packaged in an air and water occlusive vessel under a vacuum. Such a vessel may be a canister or box, but is preferably an enveloping oxygen impermeable overwrap material which is sealable to exclude air and water. The vacuum is released before sealing, allowing the vessel to backfill with a pre-determined atmosphere containing the desired amount of oxygen and an inert gas such as nitrogen or argon. When a sufficient amount of atmosphere has backfilled the vessel, the vessel is sealed, permanently maintaining the donor media in an atmosphere containing the desired amount of oxygen.

Alternatively, also in accordance with the present invention, the donor media is packaged in the vessel discussed above. However, in this embodiment, no vacuum operation is required. Before sealing, a material which functions to deplete the oxygen supply (an oxygen scavenger) is placed in the vessel. The vessel is then sealed. The oxygen scavenger depletes oxygen from the ambient atmosphere to the desired level which will maximize the donor material's shelf-life.

Oxygen scavenging materials include iron, calcium hydroxide, sulfite salt/copper sulfate, palladium, sodium silicate/sodium borohydride/iron, erythiosin dye, various enzymes, alcohol oxide.

Where the vessel comprises an overwrapping, enveloping material as discussed above, the overwrapping material must be air and water occlusive and heat sealable. Numerous commercially available heat sealable materials may be used for this purpose. Typically such enveloping material is comprised of a multi-layered film, comprised of a first inner sealable layer, bonded to a second air and water occlusive layer, and optionally a third layer which functions to protect the second air and water occlusive layer from physical and environmental abuse. However, a single layered film will also suffice, provided it is able to provide each of the foregoing functions.

Examples of commercially available materials which may be used include: aluminized mylar, aluminized polyvinylidene chloride, laminates of EVA and polypropylene which has been aluminized. Additionally, aluminum foil sandwiched between multi-layered polymers which include mylar, polyvinylidene chloride, polypropylene, paper, polyethylene, will also function in accordance with the present invention.

EXAMPLE

Accelerated aging studies were performed on typical donor media and the following illustrative results were obtained.

Testing was performed at temperatures of 90° C. and 105° C. on a sample of donor media; in air (approximately 20% oxygen), in an argon atmosphere containing 20% oxygen, in an argon atmosphere containing 5% oxygen, and in a 100% argon atmosphere.

Testing procedure consisted generally of exposing samples of control and aged donor media using a fixed intensity light source through 21 and 31 step "step-wedge" plates. Full-color step-wedge exposures were taken and used to estimate speed changes in the H & D Curve, particularly changes in the shoulder region.

Specifically, the testing procedure consisted of placing samples of donor media mounted on a support, into a conventional circulating air oven with monitoring thermal couples attached. The sample alignment was oriented in such a manner as to allow air circulation over the face of the sample. Multiple samples were introduced to the aging oven and pulled at desired time intervals. Samples pulled were then allowed to equilibrate approximately 15 minutes and were then exposed using both a 21 step and 31 step wedge system. For a 21 step wedge system, every 2 steps equal one stop. For a 31 step wedge system every three steps equal one stop.

Samples were then read using a Milton Ray Color Graph and the L* (density) values were determined as a function of the step energy. Plots for a 105° C. oven temperature using a 21 step wedge and an aluminized donor are presented in FIG. 1.

As indicated from the slope of the individual lines in FIG. 1, it was found that donor media exposed to air ages most rapidly. 20% oxygen in argon ages the media 3 to 4 times as rapidly as the 5% oxygen in argon. 100% argon ages the media at the slowest rate. However, a 100% argon atmosphere is not commercially feasible because a total depletion of oxygen eliminates all quenching effect, and the monomer undesirably thermally polymerizes prematurely.

Despite the fact that both air and the 20% oxygen in argon tests had approximately 20% oxygen present, the sample of donor media in air aged more rapidly. It has been found that this unexpected difference is due to the presence of humidity in air that also accelerates the aging process.

Thus, the present invention resides in a method to extend the shelf-life of donor media by controlling the ambient conditions during storage and manufacture, in particular by the appropriate packaging of the donor media in terms of oxygen and humidity levels of the contacting atmosphere.

While the invention has been described with respect to the details of specific illustrative embodiments, many changes and variations will become apparent to those skilled in the art upon reading this description, and such can obviously be made without departing from the scope of the invention.

Having described the invention in detail, and by reference to preferred embodiments thereof, it will be apparent that modifications and variations are possible without departing from the scope of the invention defined in the appended claims.

What is claimed is:

1. A method for storing photosensitive donor media including a support having a layer of photosensitive microcapsules on the surface comprising the steps of:
    placing said donor media in an air and humidity occlusive vessel; establishing an internal atmosphere in said vessel, said internal atmosphere containing about 1 to 5% oxygen and about 40 to 60% humidity; and sealing said donor media in said vessel.

2. The method of claim 1, wherein said vessel is a heat sealed, air and water occlusive envelope.

3. The method of claim 1, wherein said ambient atmosphere is 1 to 5% oxygen.

4. The method of claim 1, wherein said ambient humidity is 40 to 60%.

5. The method of claim 1, wherein said step of establishing said internal atmosphere includes the steps of:
    (a) placing said donor media into said vessel under a vacuum; and
    (b) releasing said vacuum before sealing of said vessel such that said vessel backfills with a pre-determined atmosphere containing oxygen and humidity within said ranges 6. The method of claim 1, wherein said step of establishing said internal atmosphere includes the steps of:
    placing said donor media into said vessel under a pre-determined ambient atmosphere containing oxygen and humidity within said ranges; and
    sealing said vessel to permanently maintain said ambient atmosphere within said vessel.

7. The method of claim 1, wherein said step of establishing said internal atmosphere includes the step of adding an oxygen scavenger and/or a dessicant to said vessel.

8. A photosensitive media having improved shelf-life comprising:
    (a) a photosensitive donor media including a support having a layer of photosensitive microcapsules on the surface; and
    (b) an air and water occlusive vessel containing an internal atmosphere of 5% oxygen and 50% humidity;
    (c) wherein said media is sealed in said vessel.

* * * * *